July 15, 1952 R. J. KIRCHER 2,603,694

SEMICONDUCTOR SIGNAL TRANSLATING DEVICE

Filed May 5, 1951 2 SHEETS—SHEET 1

INVENTOR
R. J. KIRCHER
BY [signature]
ATTORNEY

SEMICONDUCTOR SIGNAL TRANSLATING DEVICE

Filed May 5, 1951 2 SHEETS—SHEET 2

INVENTOR
R. J. KIRCHER
BY [signature]
ATTORNEY

UNITED STATES PATENT OFFICE 2,603,694

SEMICONDUCTOR SIGNAL TRANSLATING DEVICE

Reymond J. Kircher, Summit, N. J., assignor to Bell Telephone Laboratories, Incorporated, New York, N. Y., a corporation of New York Application May 5, 1951, Serial No. 224,777

16 Claims. (Cl. 175—366)

This invention relates to semiconductor signal translating devices and more particularly to such devices of the type disclosed in Patent 2,524,035, granted October 3, 1950, to J. Bardeen and W. H. Brattain.

Devices of the type disclosed in the patent above identified, which are known as transistors, comprise, in general, a body of semiconductive material having a large area or substantially ohmic connection, termed the base, thereto and having also associated therewith two other connections deisgnated the emitter and collector. In one manner of operation, signals are applied between the emitter and base and replicas thereof are obtained in a load circuit connected between the collector and base.

The mechanism of translation involves the injection, at the emitter and into the semiconductive body, of charge carriers of sign opposite that of the carriers normally in excess in the bulk of the semiconductive material. Specifically, of the body is of N conductivity-type, for example N-type germanium, the carriers normally in execess therein are electrons and the injected carriers are holes; if the body is of P conductivity-type, the carriers normally in excess therein are holes and the injected carriers are electrons. The collector is biased at the polarity to attract the injected carriers thereto. Thus, for example, for the case of an N conductivity-type body, the collector is biased negative so as to attract the positive holes. The carriers flowing to the collector region modulate the electron current flowing in the collector-base circuit.

It has been found that in such devices, the collector or output current includes random variations or noise components, the magnitude of which is markedly dependent upon both the emitter current and the potential of the collector. Such variations or noise components tend to obscure the translation of signals.

One general object of this invention is to improve the performance characteristics of semiconductor signal translating devices. More specifically, objects of this invention are to improve the fidelity of translation of signals by such devices, to reduce noise in the output of transistors and to obtain a uniform signal to noise ratio over a wide range of collector potentials.

Noise in a transistor may be ascribed, in part at least, to the random or sporadic generation within the semiconductive body of carriers of like sign to those injected at the emitter, and the flow of these generated carriers to the collector region.

In accordance with one feature of this invention, in semiconductor translating devices of the type described hereinabove, a barrier is provided within the body to substantially impede the flow to the collector region of carriers extraneously generated within the body.

In accordance with a more specific feature of this invention, there is provided within the body and in proximity to the collector a zone or region of the same conductivity-type as the body but of substantially higher conductivity than the bulk of the body.

In one illustrative embodiment of this invention, a transistor comprises a body of N conductivity-type germanium having therein a very narrow region or zone, which may be a grain boundary, also of N-type but of substantially greater conductivity than the bulk of the body, base and emitter connections to the body, and a collector connection on the higher conductivity region or grain boundary. The collector connection may be, for example, a point contact bearing against the boundary region or zone.

In another illustrative embodiment of this invention, a transistor comprises a body of N conductivity-type germanium having on one face thereof a thin layer of N-type germanium of conductivity substantially greater than that of the body bulk material, a base connection to the body, and emitter and collector connections to the face layer.

The invention and the above noted and other features thereof will be understood more clearly and fully from the following detailed description with reference to the accompanying drawing in which.

Figure 1:
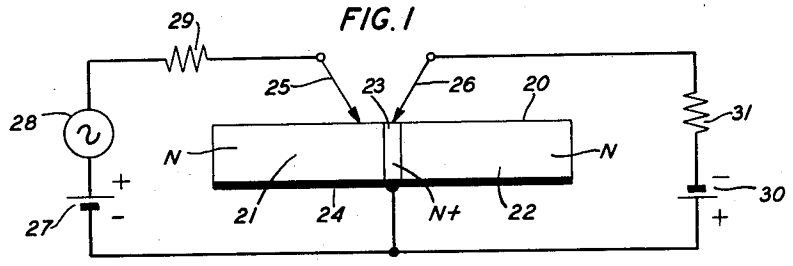
Fig. 1 is a diagram illustrating the principal components and the association therof in a signal translating device illustrative of one embodiment of this invention.

In the drawing, in the interest of clarity, certain dimensions have been greatly exaggerated; the magnitude of the exaggeration will be apparent from the typical dimensions given hereinafter.

Also in the drawing, in the semiconductive bodies the portions or regions of relatively low conductivity have been indicated by the letter N and the portions or regions of relatively high conductivity have been designated N+. The resistivity of the N material may be for example of the order of 5 ohm centimeters and resistivity of the N+ material may be of the order of 2 ohm centimeters.

Illustrative of the semiconductive materials which may be employed in devices constructed in accordance with this invention are germanium and silicon. Suitable germanium may be prepared in the manner described in the application Serial No. 638,351, filed December 29, 1945, of J. H. Scaff and H. C. Theuerer. Grain-boundaries of the type hereinafter referred to may be identified in bodies of such material by exploring a surface thereof with a small light spot and locating the boundary by noting abrupt changes in the response between terminals at opposite ends of the body as a function of the light spot position. A heat probe giving a galvanometer deflection depending on the N concentration may also be used. Suitable germanium material including N and N+ regions or zones, which in this case are not crystal grain boundaries, may be produced also in the manner disclosed in the application Serial No. 138,354, filed January 13, 1950, of J. B. Little and G. K. Teal and Serial No. 168,184, filed June 15, 1950, of G. K. Teal.

Referring now to the drawing, the signal translating device illustrated in Fig. 1 comprises a semiconductor body 20, for example of germanium, having therein two N zones 21 and 22 on opposite sides of and contiguous with an N+ zone 23 defined, for example, by a suitable crystal boundary extending through the semiconductive body. In one illustrative construction the body may be a wafer .075 inch long, .075 inch wide and .020 inch thick and the N+ zone or boundary may be substantially .0005 inch thick.

A large area or substantially ohmic connection 24, which may be, for example, a coating of rhodium or copper, is made to one face of the body 20, this connection constituting the base and engaging both the N zones and also the N+ zone. Bearing against the opposite face of the body 20 are an emitter 25 and collector 26 both of which may be point contacts, for example the collector of phosphor bronze and the emitter of beryllium copper. The emitter point bears on the N region, the collector point on the N+ region or on the edge thereof. The emitter to collector spacing advantageously is substantially 0.002 inch.

In operation of the device in the circuit shown, the emitter 25 is biased at a low voltage in the forward direction relative to the body by a source 27 and signals to be translated are impressed upon the emitter-base circuit from a signal source 28. A suitable resistor 29 may be connected in the emitter-base circuit as shown. The collector 26 is biased at a relatively high potential in the reverse direction relative to the base 24 by a source 30. A load represented generally by the resistor 31 is connected in the collector to base circuit as shown. Amplified replicas of the signals impressed by the source 28 are obtained at the load 31.

Figure 4:
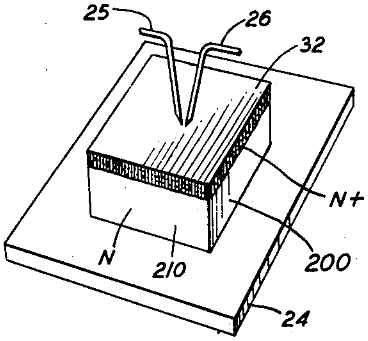
Fig. 4 is a perspective view of a transistor illustrative of another embodiment of this invention, in which the boundary between $N^+$ and N regions is substantially parallel to the surface on which the points are placed.

In the illustrative embodiment of this invention illustrated in Fig. 4, the semiconductive body 200 includes an N-type portion 210 having on one surface thereof an N+ layer 32 which may be for example of the order of 0.004 inch thick. The base connection 24 is made to the N zone 210 and the emitter and collector 25 and 26 which may be in the form of metallic point contacts, bear against the N+ layer 32, the spacing between the emitter and collector being approximately 0.002 inch.

Figure 6:
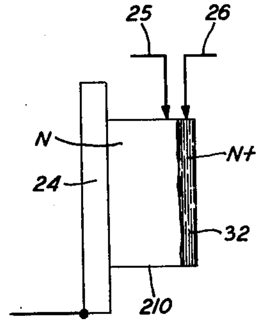
Figs. 6 and 7 are elevational views of other illustrative embodiments of this invention.

In another embodiment of this invention illustrated in Fig. 6, the semiconductive body is of the same construction as that in the device illustrated in Fig. 4, but the emitter 25 bears against the N zone or portion 210 and the collector 26 bears against the N+ zone 32 at a point in immediate proximity to the barrier or junction between the N and N+ regions or zones.

Figure 7:
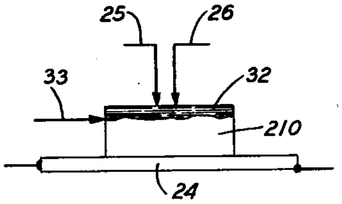

The device illustrated in Fig. 7 is similar to that shown in Fig. 4 but includes an additional contact 33, for example in the form of a pointed wire, bearing against the interface or junction between the N zone 210 and the N+ layer 32. In a similar way an additional point may be used on the interface of the two regions of Fig. 6 on the N+ region.

Figure 8:
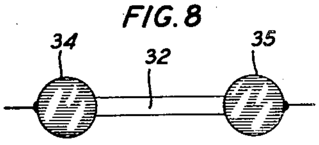
Figs. 8 and 9 are plan and elevational views respectively of a filamentary type transistor illustrative of still another embodiment of the invention.
Figure 9:
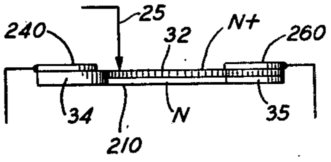

The invention may be embodied also in filamentary type transistors such as disclosed in Patent 2,502,479, granted April 4, 1950, to G. L. Pearson and W. Shockley. In one construction illustrated in Figs. 8 and 9, the semiconductive body comprises two enlarged end portions 34 and 35 connected by an intermediate filamentary portion. The body includes an N zone or region and a thin N+ layer 32 extending over a part of the N zone or region. The base connection 240 is made to the N zone or region 210 as by way of a metallic coating on the enlarged end part 34. The collector connection 260 may be a similar metallic coating upon the enlarged N portion 35, but connected to the N+ layer. The emitter 25 may be a point contact bearing against the N+ layer 32.

Figure 10A:
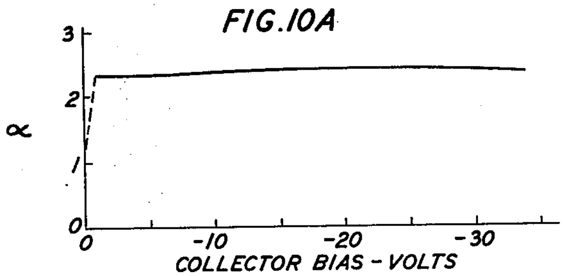
Figs. 10 and 11 are graphs depicting performance characteristics of typical point contact transistors constructed in accordance with this invention.
Figure 10B:
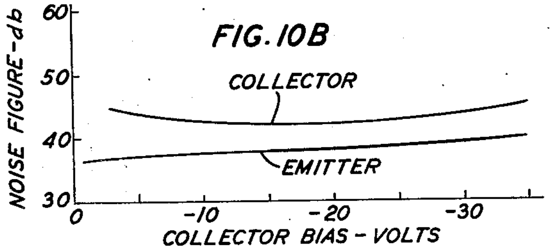

Performance characteristics of devices constructed in accordance with this invention are portrayed in Figs. 10 and 11. Specifically, the characteristics presented in Figs. 10A and 10B are for a transistor of the construction shown in Fig. 1 and described hereinabove, with the collector 26 bearing against, or immediately adjacent the edge of the N+ grain boundary 23 and for a constant emitter current of 0.50 milliampere. It will be noted from Fig. 10A that the current multiplication factor $\alpha$ is substantially constant over a wide range of collector voltages. The base and emitter resistances also were substantially constant over this range, the base resistance being about 50 ohms and the emitter resistance being about 190 ohms. The noise figure as portrayed in Fig. 10B is that at 1,000 cycles for a band width of one cycle. It will be noted from Fig. 10B that both the emitter noise and the collector noise figure considered separately are substantially constant over this collector voltage range.

Figure 11A:
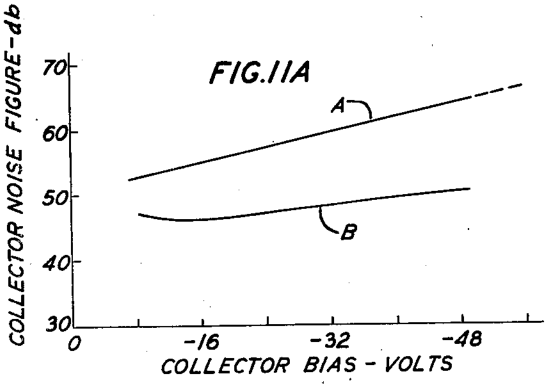
Figure 11B:
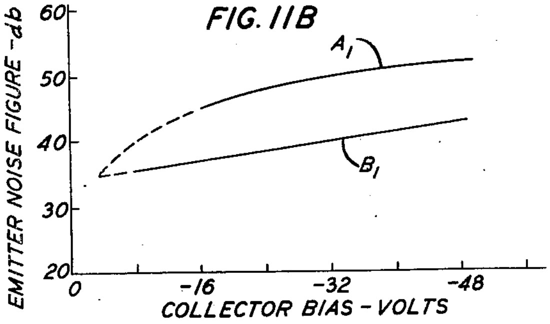

The improvement realized by this invention in the collector noise figure of transitors is indicated clearly in Figs. 11A and 11B. In the former, line A shows the average collector noise-collector voltage relation for a representative number of prior art transistors and curve B portrays this relation for a representative number of transistors of the construction illustrated in Fig. 1 with the collector 26 upon or immediately adjacent the N-$N^+$ boundary, and in Fig. 4. Similarly in Fig. 11B, curves A and B, depict the emitter noise-collector potential relation for prior art transistors and transisitors of the constructions illustrated in Figs. 1 and 4. It will noted from Figs. 11A and 11B that in devices constructed in accordance with this invention an improvement of the order of 10 decibels is exhibited for both the emitter and collector noise figures over a wide range of collector potentials.

Figure 5:
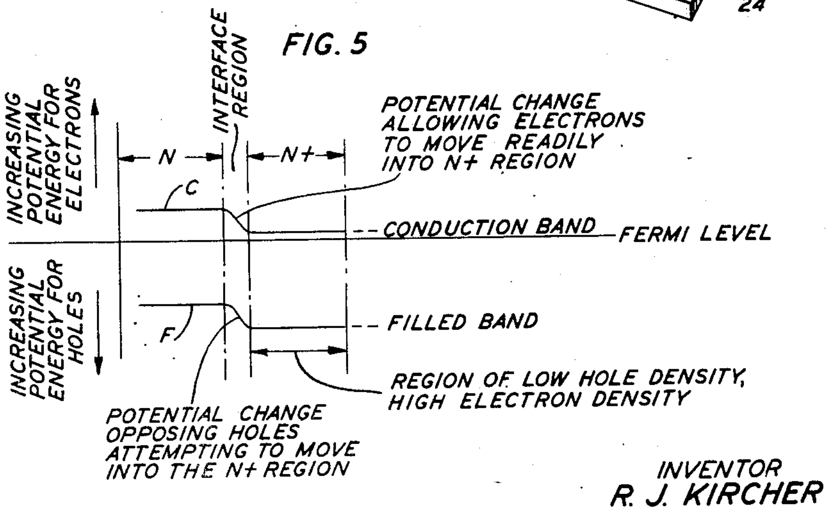
Fig. 5 is an energy diagram for the semiconductor body in the device shown in Fig. 4, taken across the N–N+ interface.

As has been noted hereinabove, in transistors, collector noise is ascribable in part at least to the extraneous generation of holes in the semiconductor body and flow of these holes to the collector region. Analysis of the energy level diagrams for devices constructed in accordance with this invention affords an explanation for the improvement in noise figures realized in such devices. In Fig. 5, which portrays the energy levels in a device of the construction shown in Fig. 4 and described hereinabove, line C represents the bottom of the conduction band and line F the top of the filled band for the N and $N^+$ zones or regions, the Fermi level being as indicated. It will be noted that at the interface between or junction of the zones or regions, the energy level contours are such as to impose a barrier to the ready passage of holes from the N into the $N^+$ region. Thus, by virtue of the semiconductive body structure the collector is shielded from the holes generated extraneously in the bulk of the N region whereby collector noise is reduced.

Figure 2:
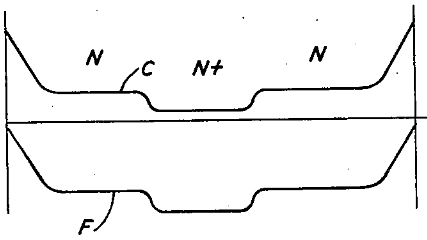
Fig. 2 is an energy level diagram for the semiconductive body included between the emitter and collector connections in the device shown in Fig. 1.
Figure 3:
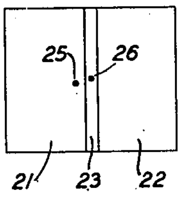
Fig. 3 is a plan view of the translating device of Fig. 1 showing the position of the emitter and collector with respect to the $N^+$ region in the semiconductive body.

Similarly, as will be seen from Fig. 2, which portrays the energy levels in the semiconductor body of devices of the construction shown in Fig. 1, because of the $N^+$ region a barrier is presented to the flow of holes generated in the N region 22 from this region to the vicinity of the collector, whereby a reduction in collector noise is effected.

The magnitude of the barrier to such flow of holes may be controlled, for example increased, by application of a potential to the $N^+$ region as by way of the auxiliary connection 33 as illustrated in Fig. 7.

Although in the specific embodiments shown and described the semiconductor body is of N conductivity-type, the invention may be practiced also in devices utilizing P-type bodies, the higher conductivity zone in this case providing a barrier to the flow to the collector of electrons generated sporadically in the bulk of the body.

Also although in the specific embodiments shown and described a sharp change in conductivity between zones has been set forth, noise improvements realized in accordance with this invention may be achieved also by tapered or gradual changes in the body conductivity, from zone to zone.

Further, it will be understood that the several embodiments of the invention shown and described are but illustrative and that various modifications may be made therein without departing from the scope and spirit of this invention.

What is claimed is:

1. A signal translating device comprising a body of semiconductive material of one conductivity-type, emitter, collector and base connections to said body, and means defining a barrier to the flow of charge carriers of sign opposite that of those normally present in said body, generated in said body, toward said collector, said means comprising contiguous zones of said material, of like conductivity-type but of substantially different conductivity.

2. A signal translating device comprising a body of semiconductive material, and emitter, collector and base connections to said body, said body being of one conductivity-type and having therein in immediate proximity to said collector a zone of said type and of substantially greater conductivity than the remainder of said body.

3. A signal translating device comprising a body of semiconductive material of one conductivity-type and having therein a region of said type but of greater conductivity than the bulk of said body, emitter and base connections to said body, and a collector connection to said region.

4. A signal translating device comprising a body of N conductivity-type germanium having therein a zone of said type but of greater conductivity than the bulk of said body, emitter and base connections to said body, and a collector connection to said zone.

5. A signal translating device comprising a body of semiconductive material of one conductivity-type and having therein a zone of said type but of substantially different conductivity than the bulk of said body, base and collector connections to said zone, and an emitter connection to said body at a point spaced from said zone.

6. A signal translating device comprising a body of semiconductive material of one conductivity-type and having therein a region of said type but of substantially greater conductivity than the remainder of said body, a point contact emitter bearing against said body at a point spaced from said region, a point contact collector bearing against said region, and a substantially ohmic connection to said region.

7. A signal translating device in accordance with claim 6 werein said body is of N conductivity-type germanium.

8. A signal translating device in accordance with claim 6 wherein said body is of silicon.

9. A signal translating device comprising a body of semiconductive material of one conductivity-type and having therein and extending between two faces thereof a region of said conductivity-type but of greater conductivity than the bulk of said body, a base connection to one of said faces and contacting said region, and emitter and collector connections to the other of said faces, said collector connection contacting said region and said emitter connection being spaced from said region.

10. A signal translating device in accordance with claim 9 wherein said body is of N-type germanium.

11. A signal translating device comprising a body of semiconductive material having on one face thereof a layer of the same conductivity-type as said body but of greater conductivity than the bulk of said body, a base connection to said body, and emitter and collector connections to said layer.

12. A signal translating device comprising a body of semiconductive material having on one face thereof a layer of the same conductivity-type as said body but of greater conductivity than the bulk of said body, a base connection to said body, emitter and collector connections to said layer, and an auxiliary connection to said layer.

13. A signal translating device comprising a body of N conductivity-type germanium having on one face thereof a thin layer of N-type but substantially greater conductiviey than the remainder of said body, a base connection to said body, and emitter and collector connections to said layer.

14. A signal translating device in accordance with claim 13 comprising an auxiliary connection to said layer.

15. A signal translating device comprising a body of semiconductive material of one conductivity-type having on one face thereof a thin layer of said type but of greater conductivity than the remainder of the body, a substantially ohmic connection to said body at a region spaced from said layer, a first point contact bearing against said layer, and a second point contact bearing against said body in proximity to said first contact but spaced from said layer.

16. A signal translating device comprising a body of semiconductive material of one conductivity-type having a filamentary portion and enlarged portions at the ends of said filamentary portion, said body having on one face of said filamentary and one of said enlarged portions a layer of said type but of greater conductivity than the bulk of said body, a base connection to the other of said enlarged portions, a collector connection to said layer at said one enlarged portion, and an emitter connection to said layer at said filamentary portion.

REYMOND J. KIRCHER.

No references cited.